(12) United States Patent
Baldonado et al.

(10) Patent No.: US 6,908,843 B2
(45) Date of Patent: Jun. 21, 2005

(54) METHOD AND SYSTEM OF WIRE BONDING USING INTERPOSER PADS

(75) Inventors: Herald M. Baldonado, La Union (PH); Celine R. Mandapat, Baguio (PH); Paul G. Perez, Baguio (PH)

(73) Assignee: Texas Instruments Incorporated, Dallas, TX (US)

( * ) Notice: Subject to any disclaimer, the term of this patent is extended or adjusted under 35 U.S.C. 154(b) by 454 days.

(21) Appl. No.: 10/066,421

(22) Filed: Jan. 30, 2002

(65) Prior Publication Data

US 2003/0122265 A1 Jul. 3, 2003

Related U.S. Application Data

(60) Provisional application No. 60/343,652, filed on Dec. 28, 2001.

(51) Int. Cl.⁷ .............................................. H01L 21/44
(52) U.S. Cl. ...................................... 438/617; 257/784
(58) Field of Search ................................ 257/784, 666, 257/786, 737; 438/617

(56) References Cited

U.S. PATENT DOCUMENTS

| 4,771,330 A | * | 9/1988 | Long |
| 4,903,114 A | * | 2/1990 | Aoki et al. |
| 5,002,895 A | * | 3/1991 | LeParquier et al. |
| 5,124,783 A | * | 6/1992 | Sawaya et al. |
| 5,168,368 A | * | 12/1992 | Gow, 3rd et al. |
| 5,293,066 A | * | 3/1994 | Tsumura |
| 5,804,468 A | * | 9/1998 | Tsuji et al. |
| 6,232,561 B1 | * | 5/2001 | Schmidt et al. |
| 6,313,519 B1 | * | 11/2001 | Gainey et al. |

* cited by examiner

Primary Examiner—S. V. Clark
(74) Attorney, Agent, or Firm—Wade James Brady, III; Frederick J. Telecky, Jr.

(57) ABSTRACT

The present invention discloses a method and system of wire bonding a semiconductor die to a lead using interposer pads. The use of disclosed embodiment of the present invention permits combined bonding wire lengths of up to 8 mm while reducing wire sweep, wire spacing violations and wire shorts.

15 Claims, 6 Drawing Sheets

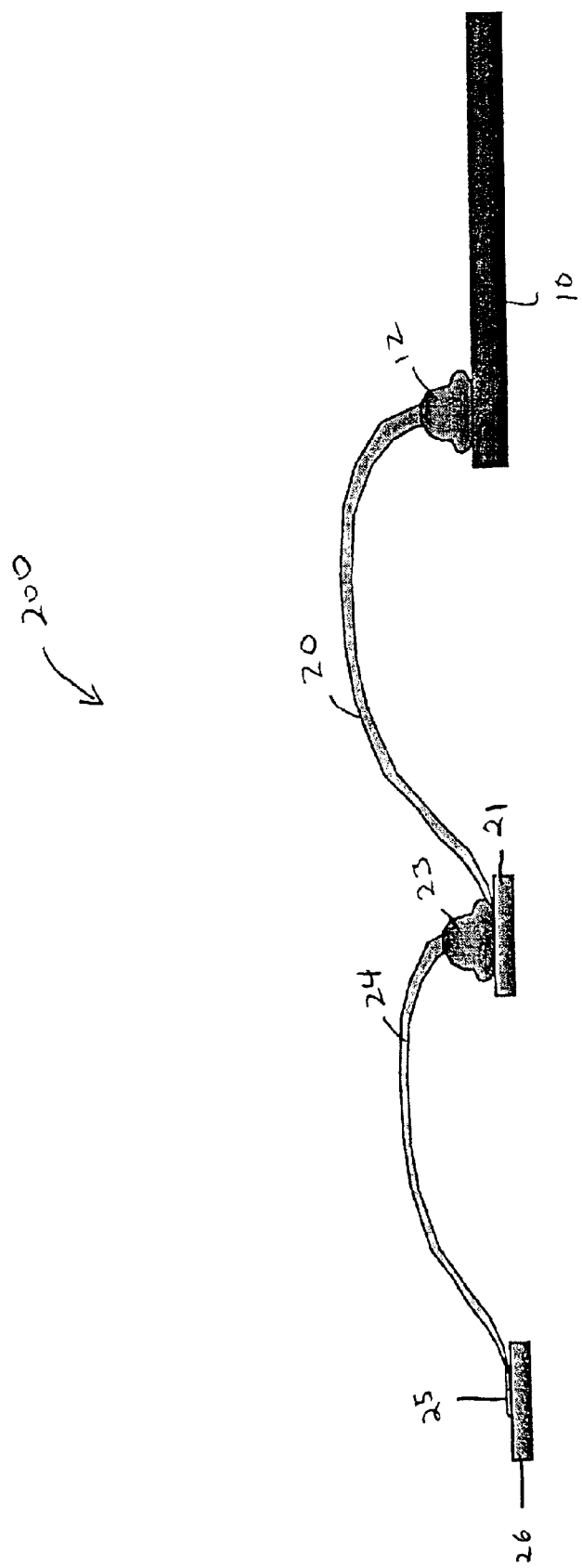

METHOD AND SYSTEM OF WIRE BONDING USING INTERPOSER PADS

CROSS REFERENCE TO RELATED APPLICATIONS

This application claims priority of U.S. Provisional Patent Application No. 60/343,652 filed on Dec. 28, 2001 entitled "Method and System of Wire Bonding Using Interposer Pads," and the teachings are incorporated herein by reference.

TECHNICAL FIELD OF THE INVENTION

The present invention relates to the fabrication and packaging of semiconductor devices, specifically a method and system of bonding wires from a semiconductor die to a lead using interposer pads.

BACKGROUND OF THE INVENTION

Conventionally, a semiconductor die is directly connected to a lead of a semiconductor package using bonding wires. Disadvantageously, this direct connection of a bonding wire from the semiconductor die to the lead requires a wire length of less than approximately 4 mm to maintain wire spacing from adjacent bonding wires and reduce wire shorts during encapsulation. Longer lengths of bonding wire can be used, however such use requires kinking of the bonding wire to maintain wire spacing. Kinking the bonding wires slows the fabrication of the semiconductor package.

SUMMARY OF INVENTION

The present invention discloses a method of wire bonding a semiconductor die to a lead using interposer pads on an electro-less substrate between the semiconductor die and the lead. This method of wire bonding allows the use of combined bonding wire lengths of up to 8 mm while reducing wire sweep, wire spacing violations and wire shorts.

BRIEF DESCRIPTION OF THE DRAWINGS

For a more complete understanding of the present invention, reference is made to the following detailed description taken in conjunction with the accompanying drawings wherein:

FIG. 2 illustrates a disclosed embodiment of the present invention.

DETAILED DESCRIPTION OF THE INVENTION

Figure 1:
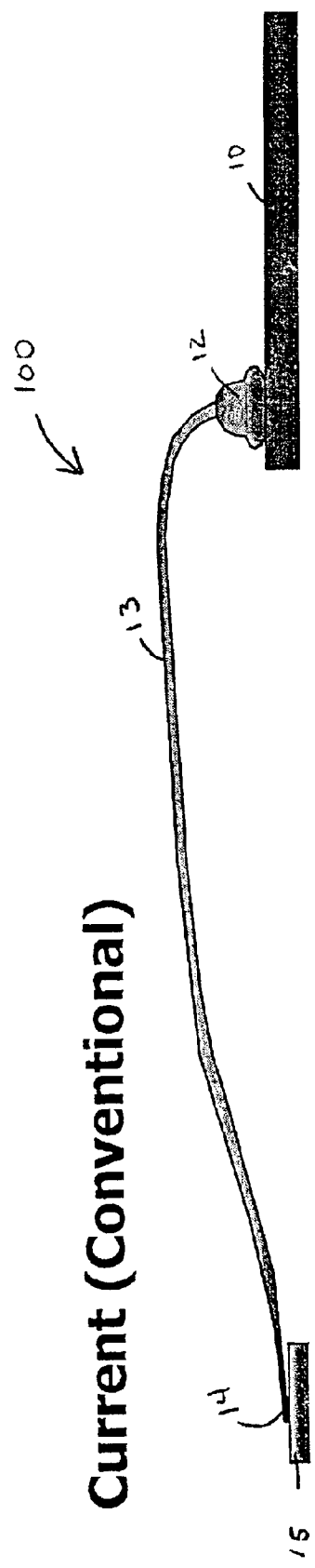
FIG. 1 illustrates the conventional method of wire bonding from a semiconductor die to a lead.

Throughout the drawings, it is noted that the same reference numerals will be used to designate like or equivalent elements having the same function. Detailed descriptions of known functions and constructions unnecessarily obscuring the subject matter of the present invention have been omitted for clarity.

FIG. 1 illustrates the conventional method of wire bonding from semiconductor die 10 to a stitch 14 on lead 15. One end of bonding wire 13 is attached to ball bond 12 located on semiconductor die 10. The other end of bonding wire 13 is attached to stitch 14 of lead 15. Disadvantageously, this direct connection of bonding wire 13 from semiconductor die 10 to lead 15 requires bonding wire lengths of less than approximately 4 mm to maintain wire spacing and reduce wire shorts during encapsulation.

The present invention 200 is illustrated in FIG. 2. It provides a method and system of wire bonding semiconductor die 10 to lead 26 using bonding wire 20 and bonding wire 24 across interposer pad 21. Preferably bonding wire 20 and 24 are made of a gold-based material. As used herein, gold-based means pure gold, gold-plated or a gold alloy. For purposes of clarity, FIG. 2 illustrates only one of multiple semiconductor die to interposer pad to lead attachments that would be made using gold-based bonding wire on a typical semiconductor package. As illustrated therein, one end of bonding wire 20 is attached to ball bond 12 on semiconductor die 10 and the other end of bonding wire 20 is attached to interposer pad 21. One end of bonding wire 24 is attached to ball bond 23 on interposer pad 21 and the other end of bonding wire 24 is attached to stitch 25 on lead 26. The use of the present invention permits combined bonding wire lengths of up to 8 mm while reducing wire sweep, wire spacing violations and wire shorts.

Figure 3:
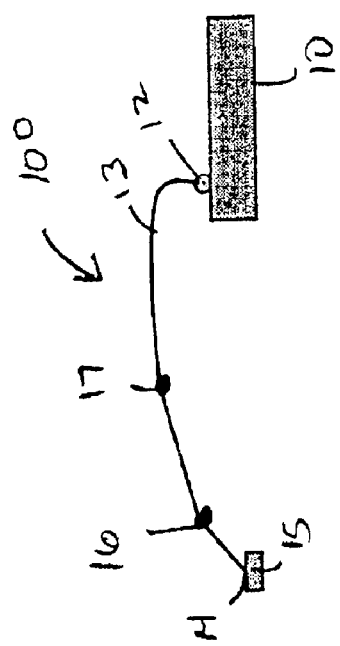
FIG. 3 illustrates the effect of kinking the bonding wire when using the conventional method of attaching the semiconductor die to the lead.

As can be seen in FIG. 3, if a longer length of bonding wire 13 is attached between semiconductor die 10 and lead 15 using the conventional method of wire bonding, bonding wire 13 must be kinked at one or a plurality of points (shown at 16 and 17) in order to maintain proper wire spacing. Disadvantageously, the process of kinking bonding wire 13 increases the time necessary to fabricate the semiconductor device.

Figure 4:
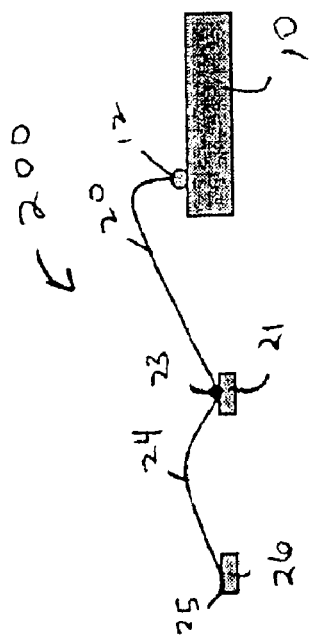
FIG. 4 illustrates the elimination of the need to kink the bonding wire in the disclosed embodiment of the present invention.

As shown in FIG. 4, the use of interposer pad 21 advantageously allows the combined length of bonding wires 20 and 24 to equal or exceed that of bonding wire 13 as shown in FIG. 3, without the need for kinking. Fabrication times are increased because bonding wires 20 and 24 are ordinary loops without the need for special modification.

Figure 5:
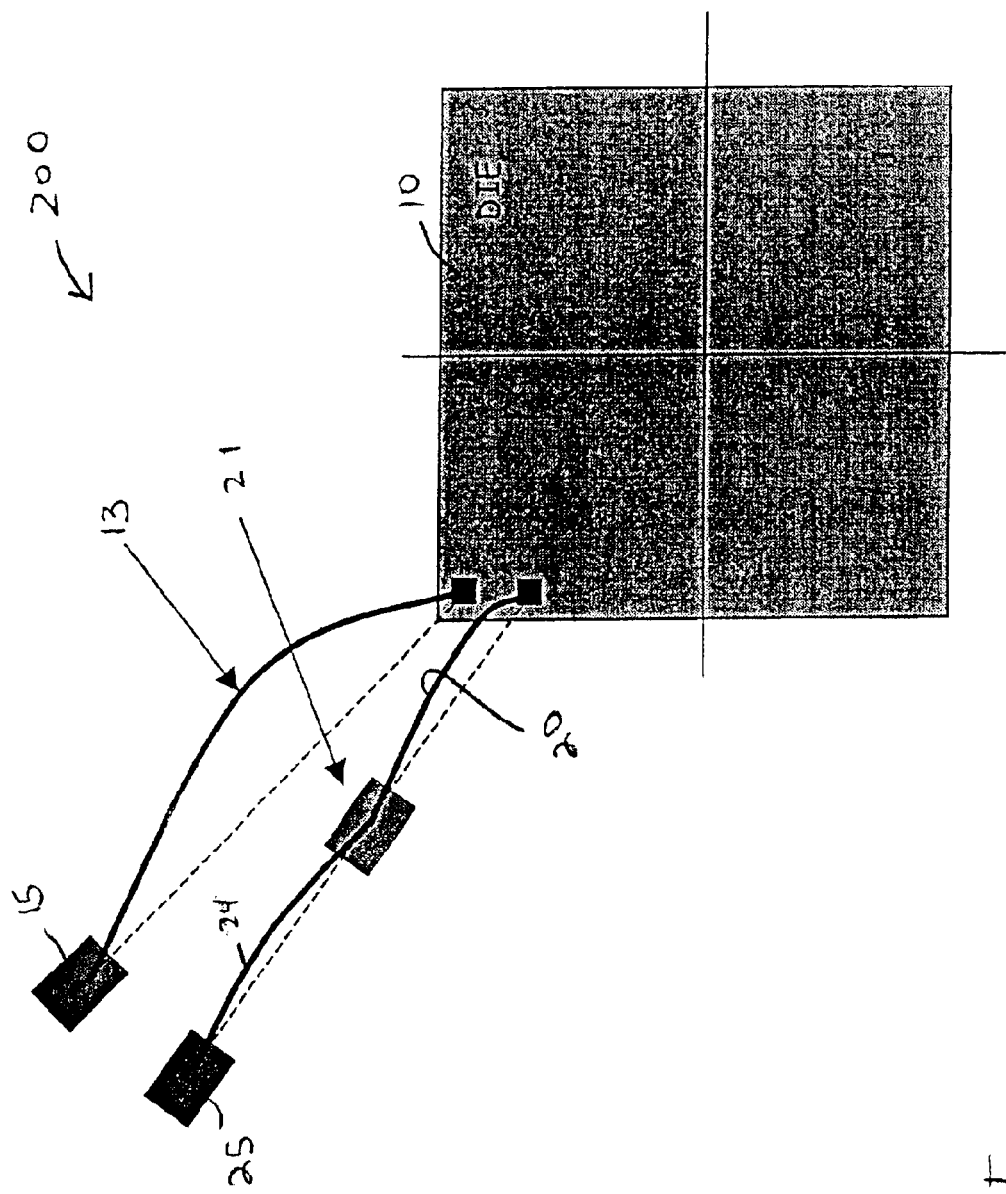
FIG. 5 is a top view of the semiconductor die and bonding wires comparing wire sweep using the conventional method of wire bonding and wire sweep using the disclosed embodiment of the present invention.

FIG. 5 is a top view of semiconductor die 10 and leads 15 and 25, comparing the wire sweep of bonding wire 13 using the conventional method of wire bonding and the wire sweep of the wires 20 and 24 using the disclosed embodiment of the present invention. As can be seen therein, the wire sweep of bonding wire 13 using the conventional technique is wider than the wire sweep of bonding wires 20 and 24 of the disclosed embodiment of the present invention. Advantageously, the narrower wire sweep of bonding wires 20 and 24 as seen in FIG. 5 decreases the risk of wire spacing violations and, thus, wire shorts.

Figure 6:
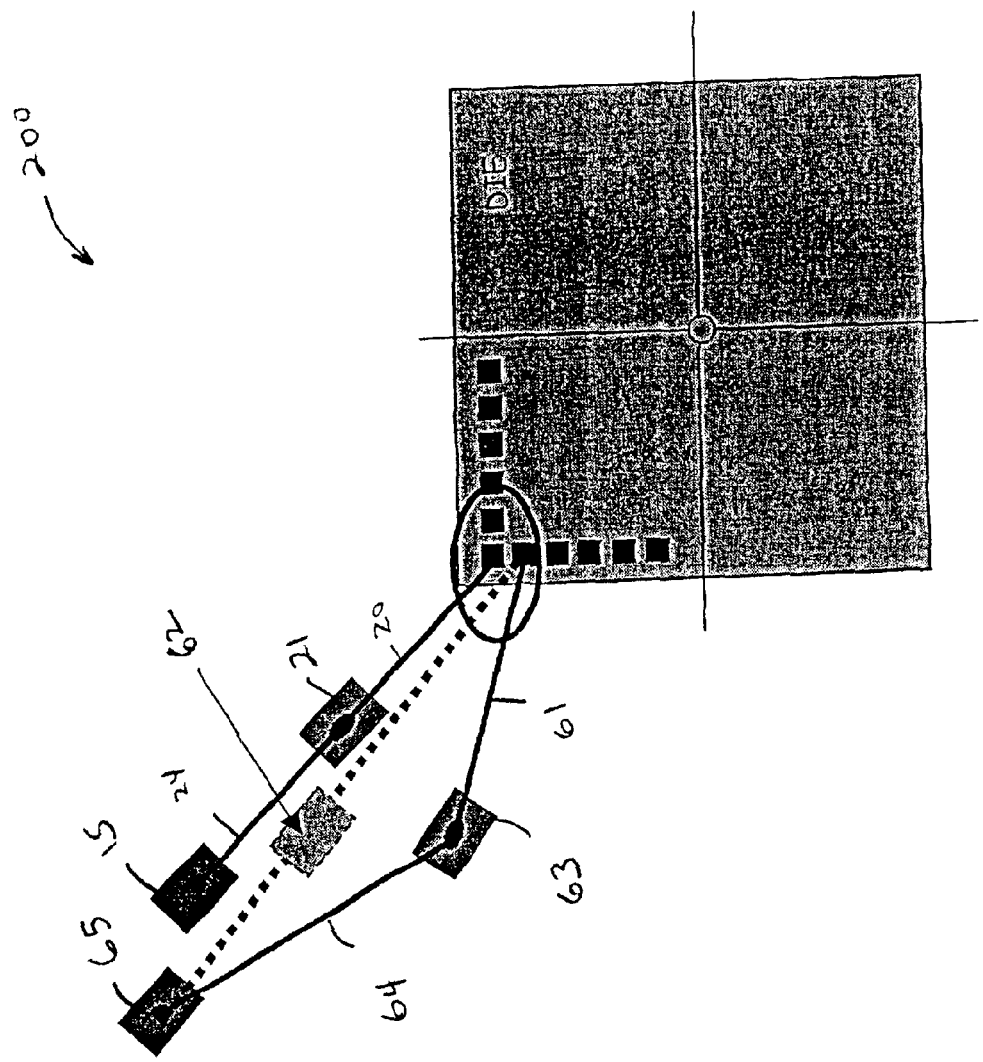
FIG. 6 is a top view of the semiconductor die and the bonding wires frame illustrating the separation of the bonding wires in the disclosed embodiment of the present invention.

FIG. 6 is a top view of semiconductor die 10, leads 15 and 65 and interposer pads 21 and 63, illustrating separation of bonding wires 20 and 61 and bonding wires 24 and 64. If interposer pad 63 is placed too close to interposer pad 21, as shown using hypothetical interposer pad 62, then potential wire to wire clearance problems arise. Advantageously, the use and placement of interposer pads 21 and 63 permits flexibility in wire to wire spacing so as to reduce or eliminate wire spacing violations and wire shorts.

Figure 7:
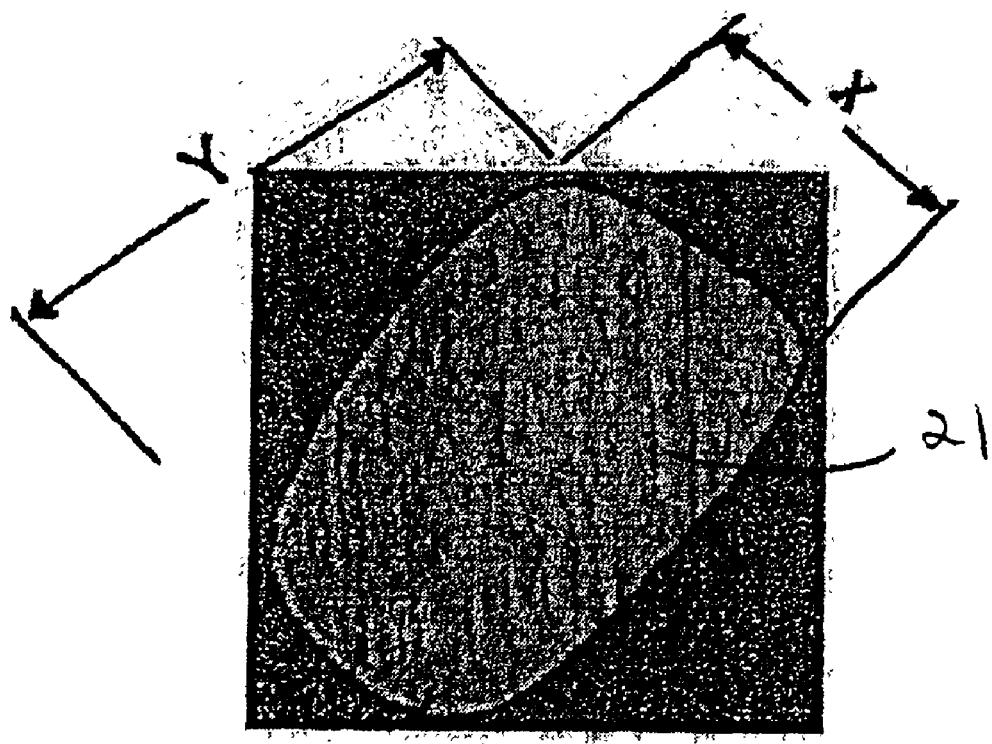
FIG. 7 is a magnified, top view of an interposer pad.

The disclosed embodiment of the present invention is optimized for use in ball grid array ("BGA") packages, such as the MicroStar® BGAs fabricated by Texas Instruments. The present invention can also be used in other semiconductor packages. Preferably, the bonding wire used in the invention is gold-based. The interposer pads can be implemented using a variety of techniques with the interposer pads composed of a variety of materials, including nickel, gold, copper, carbon and aluminum. FIG. 7 shows a magnified top view of a single interposer pad. As seen therein, each interposer pad 21 can have a variety of dimensions from 58 micrometers by 93 micrometers along an x-axis to 78 micrometers to 125 micrometers along a y-axis.

The numerous innovative teachings of the present application are described with particular reference to the present exemplary embodiment. However, it should be understood that this embodiment provides only one example of the many advantageous uses and innovative teachings herein. In general, statements made in the specification of the present application do not necessarily delimit any of the various claimed inventions. Moreover, some statements may apply to some inventive features, but not to others.

Although an exemplary embodiment of the present invention has been illustrated in the accompanied drawings and described in this detailed description, it is understood that the invention is not limited to the embodiment disclosed, but is capable of numerous rearrangements, modifications, and substitutions without departing from the spirit of the invention as set forth and defined by the following claims.

What is claimed is:

1. A method and system of wire bonding a semiconductor die to a lead, comprising the steps of:

attaching a first end of a first bonding wire to a semiconductor die with a ball bond;

attaching a second end of the first bonding wire to an interposer pad with a stitch bond;

attaching a first end of a second bonding wire, to the interposer pad with a ball bond; and attaching the second end of the second bonding wire to the lead with a stitch bond.

2. The method and system of wire bonding a semiconductor die to a lead as recited in claim 1, wherein the first bonding wire and second bonding wire are made-of a gold-based material.

3. The method and system of wire bonding a semiconductor die to a lead as recited in claim 1, wherein the interposer pad has x-y dimensions of between approximately 58 micrometers to 88 micrometers along an x-axis and 88 micrometers along a y-axis.

4. The method and system of wire bonding a semiconductor die to a lead as recited in claim 1, for use in ball bond grid array packages.

5. A semiconductor device comprising:
   a semiconductor die disposed on a substrate;
   a plurality of interposer pads on said substrate;
   a plurality of leads on the substrate;
   a plurality of bonding wires attached to the semiconductor die with ball bonds and to the leads with stitch bonds, said wires attached to said interposer pads.

6. The semiconductor device as recited in claim 5, wherein the plurality of bonding wires are comprised of gold-based material.

7. The semiconductor device as recited in claim 5, wherein each of said bonding wires comprises a bonding wire between the semiconductor die and each interposer pad attached to a bonding pad on the semiconductor die with a ball bond and to said interposer pad with a stitch bond and a bonding wire between the interposer pad and the lead attached to the interposer pad with a ball bond and to each lead with a stitch bond.

8. The semiconductor device as recited in claim 5, wherein the interposer pads are dimensioned from 58 micrometers to 88 micrometers along an x-axis and from 88 to 125 micrometers along a y-axis.

9. The semiconductor device as recited in claim 5, wherein the semiconductor package comprises a ball grid array.

10. The semiconductor device as recited in claim 5 wherein an interposer pad electrically floats on the substrate.

11. A method of fabricating a semiconductor device, comprising:

attaching a semiconductor die to a substrate having a plurality of leads and a plurality of interposer pads arranged around said die;

coupling the die to the plurality of interposer pads with a first plurality of bonding wires ball bonded to said die and stitch bonded tosaid interposer pads; and coupling the plurality of interposer pads to the plurality of leads with a second plurality of bonding wires ball bonded to said interposer pads and stitch bonded to said leads.

12. The method of fabricating a semiconductor device as recited in claim 11, wherein the plurality of interposer pads electrically float on the semiconductor package.

13. The method of fabricating a semiconductor device as recited in claim 11, wherein the plurality of interposer pads electrically float on the semiconductor package.

14. The method of fabricating a semiconductor device as recited in claim 11, wherein the placement of the interposer pads are operable to reduce wire sweep.

15. The method of fabricating a semiconductor device as recited in claim 11, wherein the semiconductor package comprises a ball grid array.

* * * * *